(12) United States Patent
Smith et al.

(10) Patent No.: US 9,837,314 B2
(45) Date of Patent: Dec. 5, 2017

(54) SELF-ALIGNMENT OF METAL AND VIA USING SELECTIVE DEPOSITION

(71) Applicant: Tokyo Electron Limited, Minato-ku, Tokyo (JP)

(72) Inventors: Jeffrey Smith, Clifton Park, NY (US); Anton J. deVilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/423,320

(22) Filed: Feb. 2, 2017

(65) Prior Publication Data

US 2017/0221760 A1 Aug. 3, 2017

Related U.S. Application Data

(60) Provisional application No. 62/290,282, filed on Feb. 2, 2016.

(51) Int. Cl.
*H01L 21/00* (2006.01)
*H01L 21/768* (2006.01)
*H01L 21/033* (2006.01)

(52) U.S. Cl.
CPC .... *H01L 21/76897* (2013.01); *H01L 21/0332* (2013.01); *H01L 21/0337* (2013.01); *H01L 21/76816* (2013.01); *H01L 21/76831* (2013.01)

(58) Field of Classification Search
CPC ......... H01L 21/76897; H01L 21/76816; H01L 21/0332; H01L 21/0337; H01L 21/76831
See application file for complete search history.

(56) References Cited

U.S. PATENT DOCUMENTS

| | | | | | |
|---|---|---|---|---|---|
| 7,700,427 | B2* | 4/2010 | Specht | .................. | H01L 27/115 257/E21.179 |
| 7,704,876 | B2* | 4/2010 | Gambino | .......... | H01L 21/76807 257/E21.579 |
| 7,714,079 | B2* | 5/2010 | Lin | ......................... | C08G 77/04 428/447 |
| 7,723,237 | B2* | 5/2010 | Hyland | ............. | H01L 21/02063 257/E21.215 |
| 9,698,200 | B2* | 7/2017 | Li | ......................... | H01L 27/228 |

* cited by examiner

*Primary Examiner* — Richard Booth

(57) ABSTRACT

Techniques herein include methods of patterning substrates such as for back end of line (BEOL) metallization processes. Techniques herein enable fully self-aligned vias and lines. Processes herein include using selective deposition, protective films and combination etch masks for accurately patterning a substrate. In a substrate having uncovered portions of metal material and dielectric material, the dielectric material is grown upwardly without covering metal material. This raised dielectric material is conformally protected and used in subsequent patterning step to align via and line placement. Such combinations mitigate overlay errors.

10 Claims, 12 Drawing Sheets

US 9,837,314 B2

SELF-ALIGNMENT OF METAL AND VIA USING SELECTIVE DEPOSITION

CROSS REFERENCE TO RELATED APPLICATIONS

The present application claims the benefit of U.S. Provisional Patent Application No. 62/290,282, filed on Feb. 2, 2016, entitled "Self-Alignment of Metal and Via Using Selective Deposition," which is incorporated herein by reference in its entirety.

BACKGROUND OF THE INVENTION

This disclosure relates to substrate processing, and, more particularly, to techniques for patterning substrates including patterning semiconductor wafers.

Methods of shrinking line-widths in lithographic processes have historically involved using greater-NA optics (numerical aperture), shorter exposure wavelengths, or interfacial media other than air (e.g., water immersion). As the resolution of conventional lithographic processes has approached theoretical limits, manufacturers have started to turn to double-patterning (DP) methods to overcome optical limitations.

In material processing methodologies (such as photolithography), creating patterned layers comprises the application of a thin layer of radiation-sensitive material, such as photoresist, to an upper surface of a substrate. This radiation-sensitive material is transformed into a relief pattern which can be used as an etch mask to transfer a pattern into an underlying layer on a substrate. Patterning of the radiation-sensitive material generally involves exposure to actinic radiation through a reticle (and associated optics) onto the radiation-sensitive material using, for example, a photo-lithography system. This exposure can then be followed by the removal of irradiated regions of the radiation-sensitive material (as in the case of positive photoresist), or non-irradiated regions (as in the case of negative resist) using a developing solvent. This mask layer can comprise multiple sub-layers.

Conventional lithographic techniques for exposing a pattern of radiation or light onto a substrate have various challenges that limit a size of features exposed, and limit pitch or spacing between exposed features. One conventional technique to mitigate exposure limitations is that of using a double patterning approach to allow the patterning of smaller features at a smaller pitch than what is currently possible with conventional lithographic techniques.

SUMMARY

As smaller devices are fabricated, the critical dimension (CD) or resolution of patterned features is becoming more challenging to produce. On top of that concern, an additional challenge is that of overlay such as photolithographic misalignment. If masks and patterns are not properly aligned, then device defects and failures can occur as lines are either partially cut or not cut at desired locations, or as openings are misplaced or shorts are otherwise created. Such misalignment is a challenge with metallization of substrates as multiple layers of metal lines and vias interconnect transistors. Not only is overlay a challenge, but another challenge with metallization is creating trenches and vias without damaging surrounding dielectric material.

Techniques herein include methods of patterning substrates such as for back end of line (BEOL) metallization processes. Techniques herein enable fully self-aligned vias and lines. Processes herein include using selective deposition, protective films and combination etch masks for accurately patterning a substrate.

In one embodiment a substrate is received having first metal lines that alternate with first dielectric lines on a working surface of the substrate. The first metal lines and the first dielectric lines are uncovered and define a planar surface together. Second dielectric lines are formed on the first dielectric lines by selectively depositing a dielectric material on the first dielectric lines without depositing the dielectric material on the first metal lines. The second dielectric lines define trenches and leave the first metal lines uncovered. Alternatively, the first metal lines are recessed relative to the first dielectric lines.

A conformal film is deposited on the working surface of the substrate. The conformal film covers sidewalls and top surfaces of the second dielectric lines and covers top surfaces of the first metal lines. The conformal film provides a predetermined etch resistivity. A dielectric layer is deposited that fills the defined trenches, covers the second dielectric lines, and provides a planar surface to the working surface of the substrate. A first relief pattern is formed above the dielectric layer. The first relief pattern defines locations of second metal lines to be transferred into the dielectric layer. A second relief pattern is formed above the dielectric layer. The second relief pattern defines locations of vias to be transferred into the dielectric layer.

The second relief pattern is transferred into the dielectric layer by using the second relief pattern as a first etch mask and etching through the dielectric layer stopping on the conformal film above the first metal lines. The conformal film preventing etching of the second dielectric lines and the first metal lines uncovered by the second relief pattern. The first relief pattern is transferred into the dielectric layer by using the first relief pattern as a second etch mask and etching into the dielectric layer stopping on top surfaces of the second dielectric lines using the conformal film as an etch stop layer. Subsequently, the relief patterns can be removed, and the substrate metallized having fully self-aligned vias.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following

DETAILED DESCRIPTION

Techniques herein include methods of patterning substrates such as for back end of line (BEOL) metallization processes. Techniques herein enable fully self-aligned vias and lines. Processes herein include using selective deposition, protective films and combination etch masks for accurately patterning a substrate. Such combinations mitigate overlay errors by using underlying structures to self-align patterns, and protect sensitive dielectric materials from being degraded.

Figure 1A:
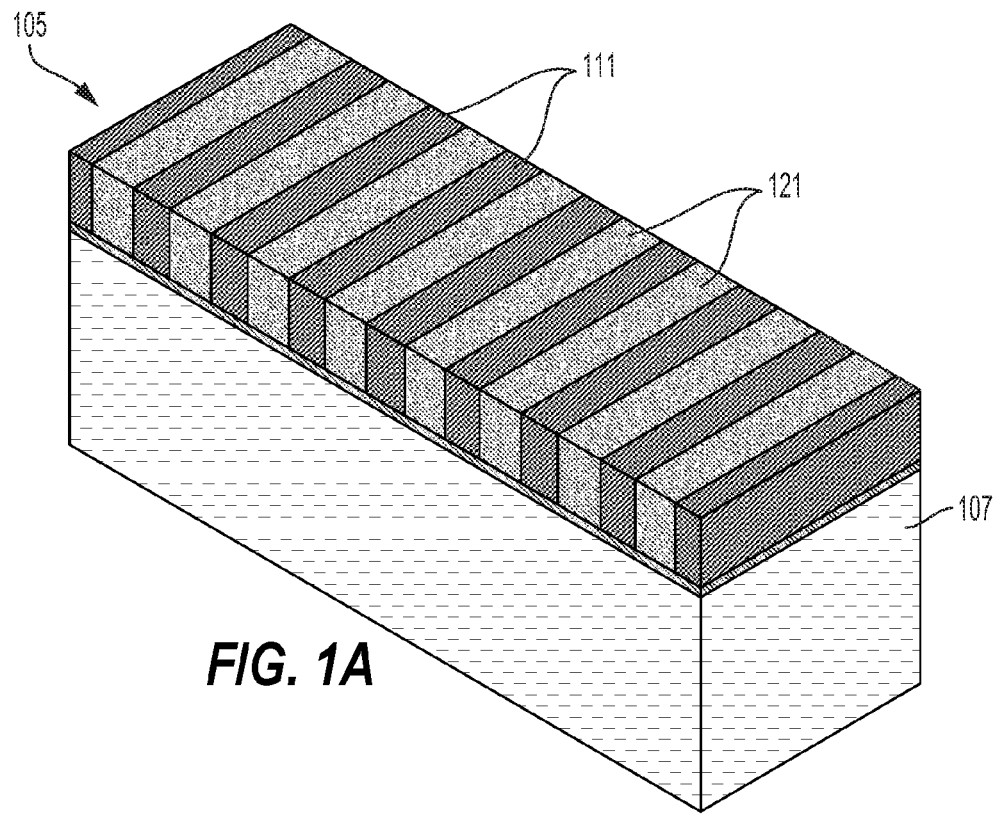
FIGS. 1A and 1B are cross-sectional schematic views of an example substrate segment showing a process flow according to embodiments disclosed herein.
Figure 1B:
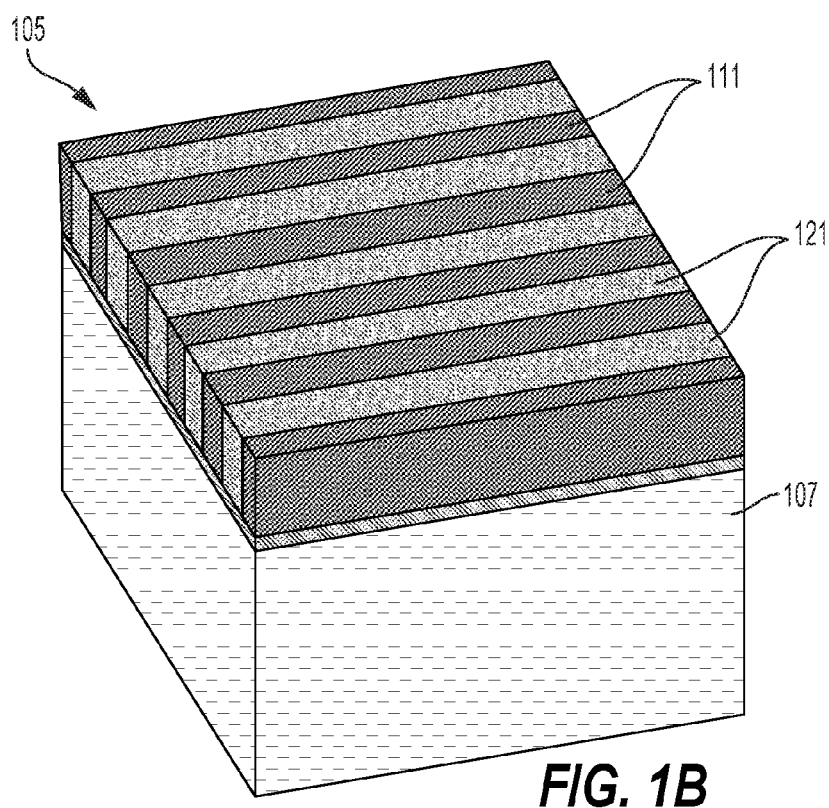

One embodiment includes a method for patterning a substrate such as a semiconductor wafer. Referring now to FIGS. 1A and 1B, a substrate is received having first metal lines 111 that alternate with first dielectric lines 121 on a working surface of the substrate 105. The first metal lines 111 and the first dielectric lines 121 are uncovered and define a planar surface together. Such a surface can result from a chemical-mechanical polishing (CMP) step. Note that the entire working surface of the substrate may not include such alternating lines, but at least some portions or regions have these alternating lines. Note also that lines can be straight or have a curvature. Other portions of the substrate can have various different structures. Also, the substrate can have contacts underneath this layer of alternating lines connecting metal lines to devices such as transistors. Underlying layer 107 is depicted as a single material, but multiple layers and structures can comprise underlying layer 107. FIGS. 1A and 1B, as well as the subsequent figures are perspective views of an example substrate segment with figures having a letter "A" illustrating one perspective and figures having a letter "B" illustrating a different view at a perspective approaching that of a side view, to better illustrate example processes herein.

Figure 2A:
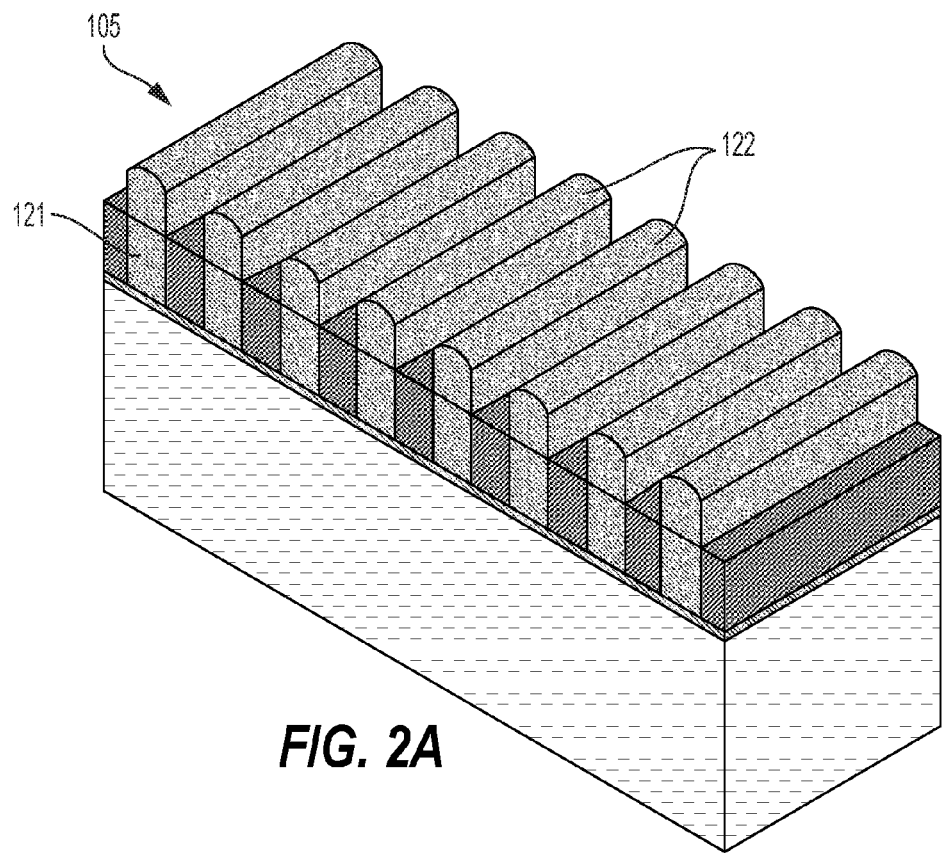
FIGS. 2A and 2B are cross-sectional schematic views of an example substrate segment showing selective deposition and process flow according to embodiments disclosed herein.
Figure 2B:
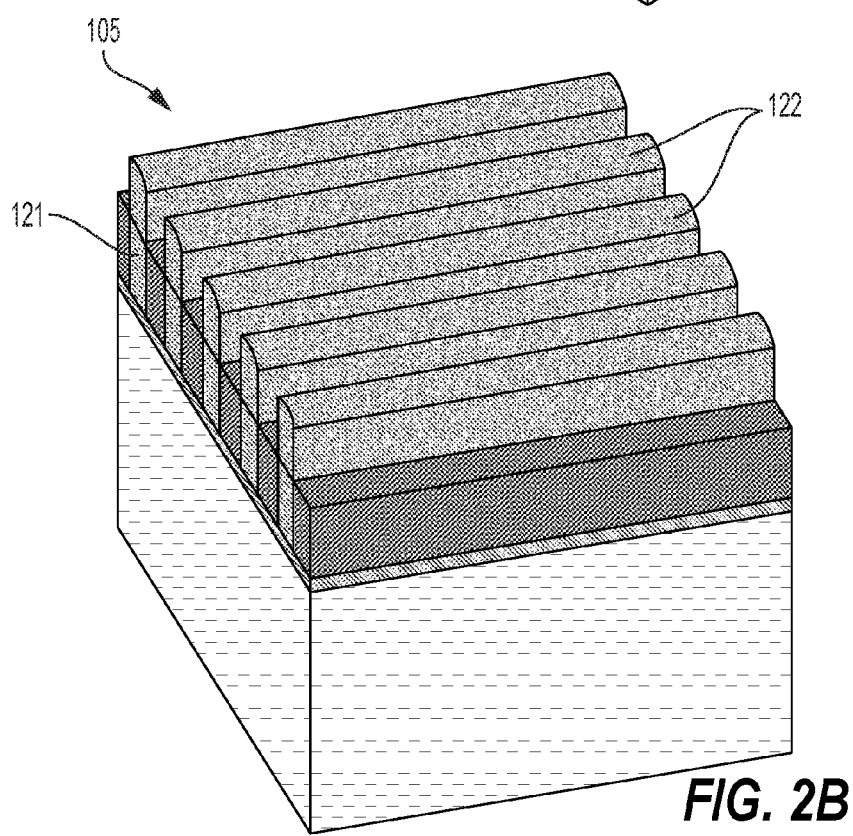

Referring now to FIGS. 2A and 2B, second dielectric lines 122 are formed on the first dielectric lines 121 by selectively depositing a dielectric material on the first dielectric lines 121 without depositing the dielectric material on the first metal lines 111. As a result, the second dielectric lines 122 define trenches leaving the first metal lines 111 uncovered. In other words, using selective deposition techniques, the dielectric lines are essentially grown upward. The height of these second dielectric lines 122 can be equivalent to a predetermined design height of corresponding vias to be fabricated (for example). Various materials can be selected for use. For example, the first dielectric lines can be an oxide material, and then more oxide material (or other dielectric material) is deposited thereon, without being deposited on or directly over the first metal lines. Thus, deposition should not have profile degradation.

A given dielectric material deposited on the first dielectric lines 121 can benefit from being selected to have similar properties as the first dielectric lines, which can include an ultra low-K material. Selective deposition can be achieved using various techniques. One technique is vapor phase self-assembled monolayers (SAMs). Atomic layer deposition (ALD) can be used, but ALD processes can be inhibited by hydrophobic surfaces. Accordingly, surface treatments can be executed for enhancing selective deposition processes by changing a wetting angle to be compatible with a particular material being deposited.

Figure 3A:
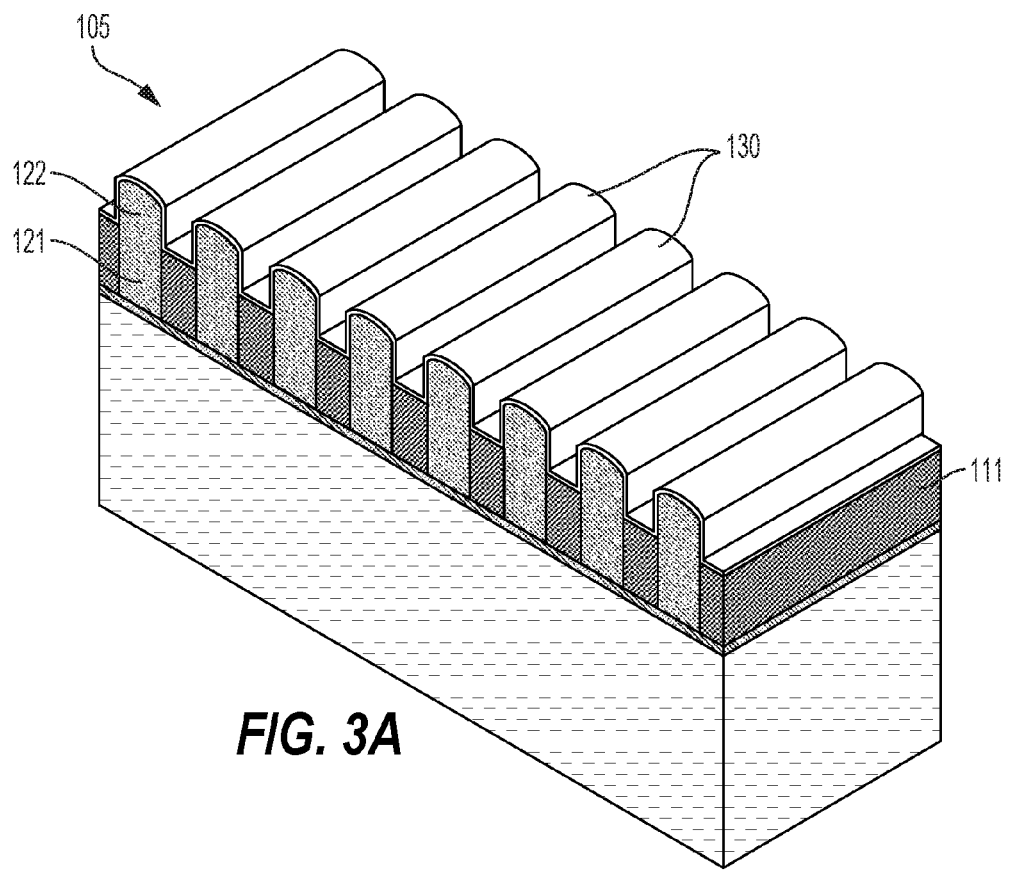
FIGS. 3A and 3B are cross-sectional schematic views of an example substrate segment showing conformal film deposition and process flow according to embodiments disclosed herein.
Figure 3B:
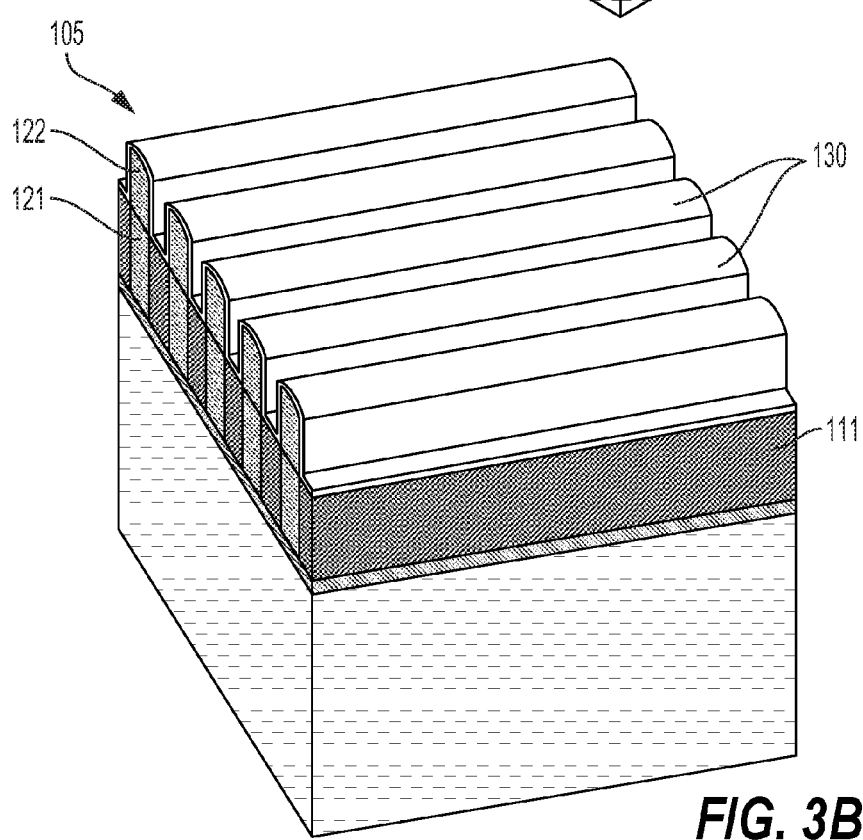

Referring now to FIGS. 3A and 3B, a conformal film 130 is deposited on the working surface of the substrate 105. The conformal film 130 covers sidewalls and top surfaces of the second dielectric lines 122 and covers top surfaces of the first metal lines 111. The conformal film 130 provides a predetermined etch resistivity. Preferably the etch resistivity of the conformal film 130 differs from etch resistivity of the dielectric material and metal. Accordingly, a particular chemistry can be used to etch dielectric material without etching material of the conformal film. In other words, a comparatively thin film is deposited on the working surface of the substrate to function as an etch stop layer in subsequent steps—at least as an etch stop layer for a via etch. A given conformal film deposited over the metal lines can benefit from having the same dielectric characteristics as the dielectric material(s) being used, but with a different etch selectivity.

Figure 4A:
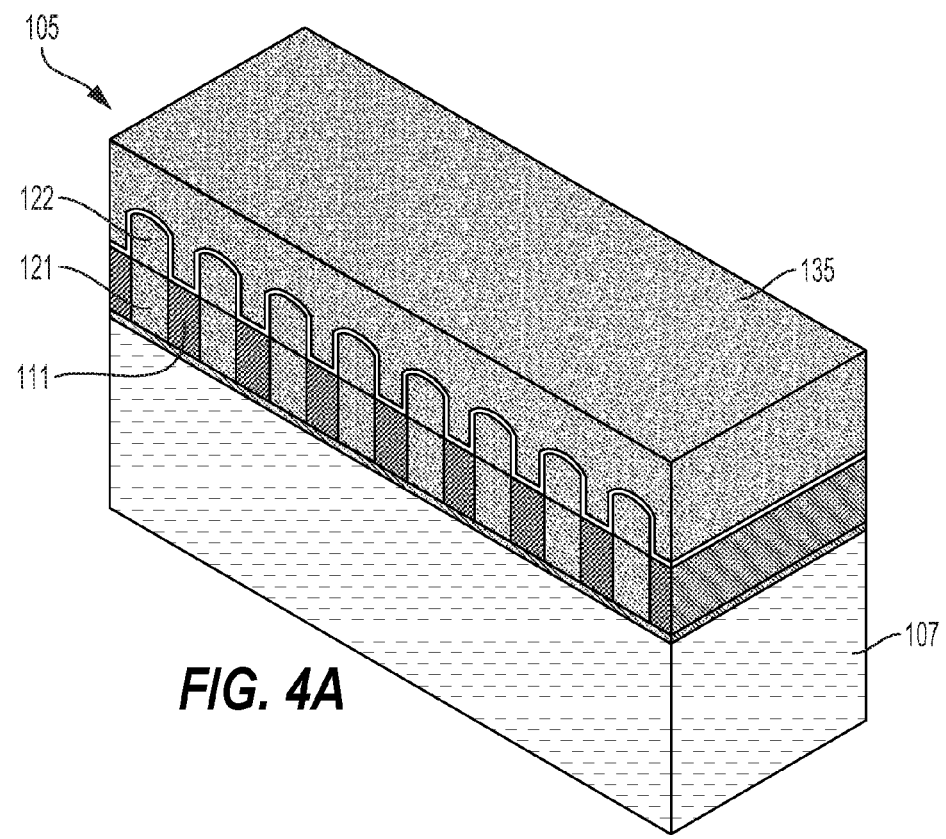
FIGS. 4A and 4B are cross-sectional schematic views of an example substrate segment showing planarization and process flow according to embodiments disclosed herein.
Figure 4B:
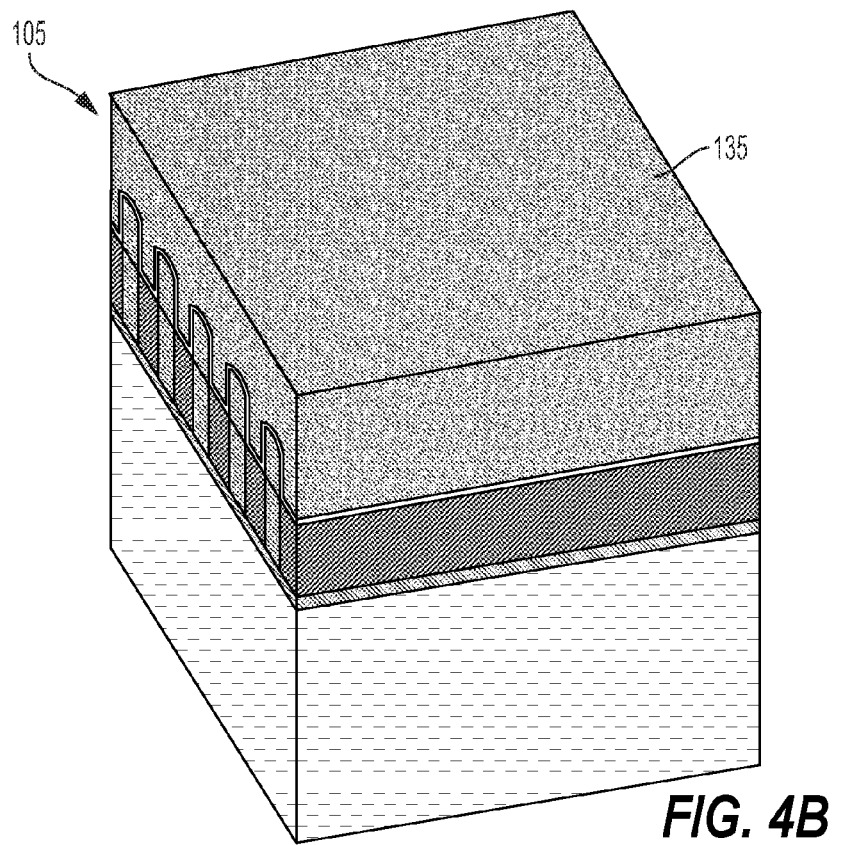

Referring now to FIGS. 4A and 4B, a dielectric layer 135 is deposited on the substrate such that the dielectric layer 135 fills the defined trenches, covers the second dielectric lines 122, and provides a planar surface to the working surface of the substrate. For example, a dielectric layer can be deposited by spin-on deposition to essentially planarize the working surface of the substrate and fill-in all defined openings and provide an overburden of material. Other deposition techniques can be used that result in a dielectric layer providing a planar surface. Having a planar surface is beneficial for subsequent etch masks to be formed thereon.

Figure 5A:
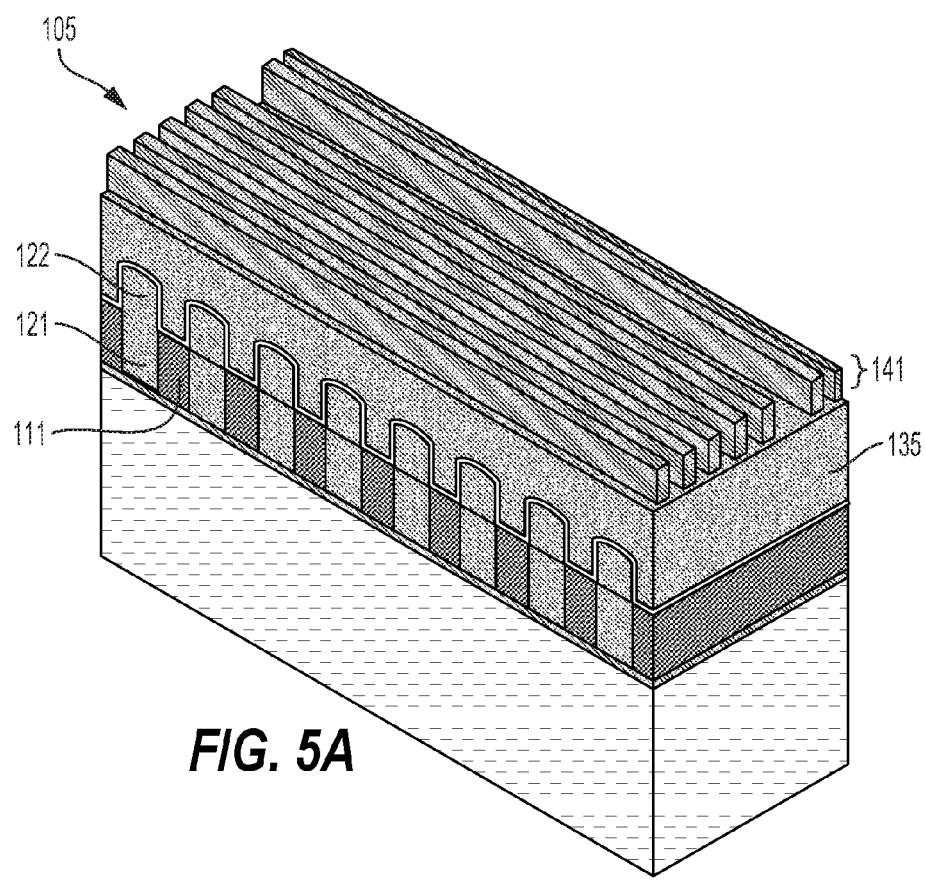
FIGS. 5A and 5B are cross-sectional schematic views of an example substrate segment showing mask creation and process flow according to embodiments disclosed herein.
Figure 5B:
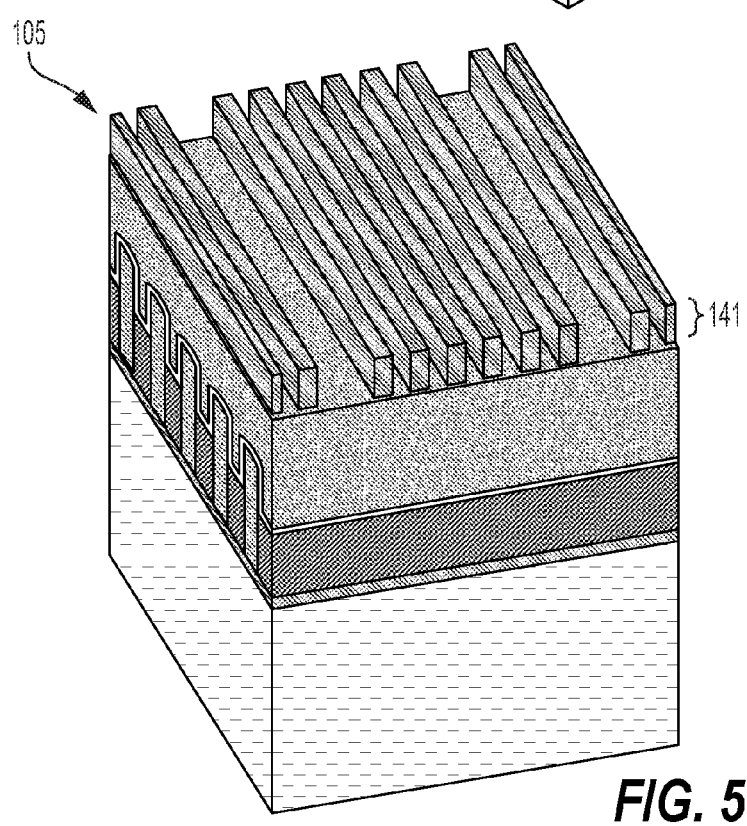

Referring now to FIGS. 5A and 5B, a first relief pattern 141 is formed above the dielectric layer 135. The first relief pattern 141 defines locations of second metal lines to be transferred into the dielectric layer 135. Such a first relief pattern can be the product of conventional photolithographic patterning and/or double patterning techniques such as self-aligned quad patterning processes. The first relief pattern 141 can be a photoresist pattern or be formed within a hardmask material such as titanium nitride. Having a metal-containing hardmask can provide etch selectivity benefits.

Figure 6A:
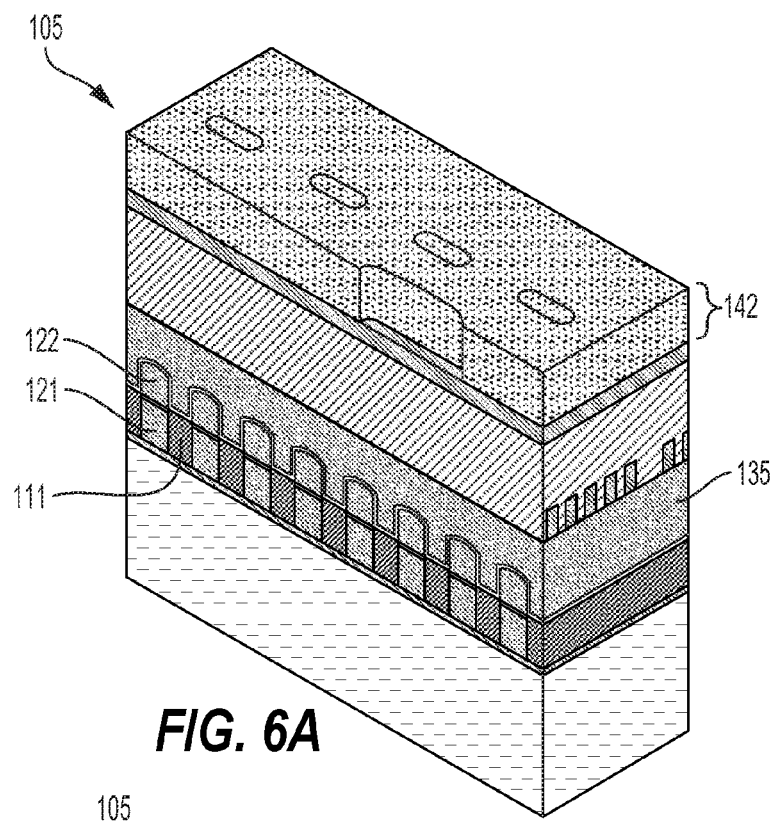
FIGS. 6A and 6B are cross-sectional schematic views of an example substrate segment showing mask creation and process flow according to embodiments disclosed herein.
Figure 6B:
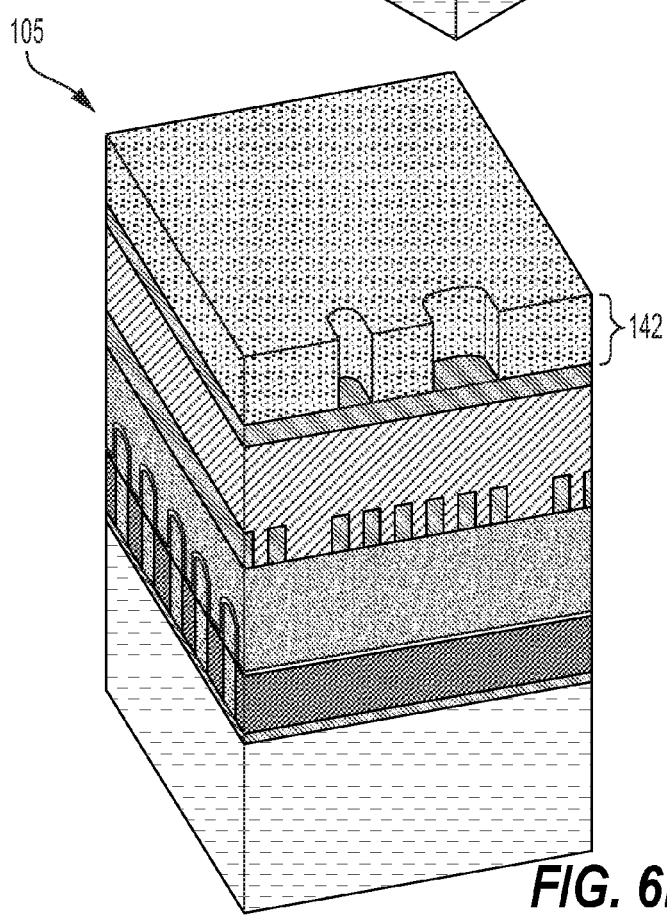

Referring now to FIGS. 6A and 6B, a second relief pattern 142 is formed above the dielectric layer 135. The second relief pattern can define locations of vias to be transferred into the dielectric layer. In other words, a via "keep" pattern can be created. Note that additional intermediate layers can be used such as planarization layers, anti-reflective coating layers, et cetera. The second relief pattern can be formed above the first relief pattern or in plane with the first relief pattern, such as by executing a freeze operation that prevents subsequent solubility changes of the first relief pattern.

Figure 7A:
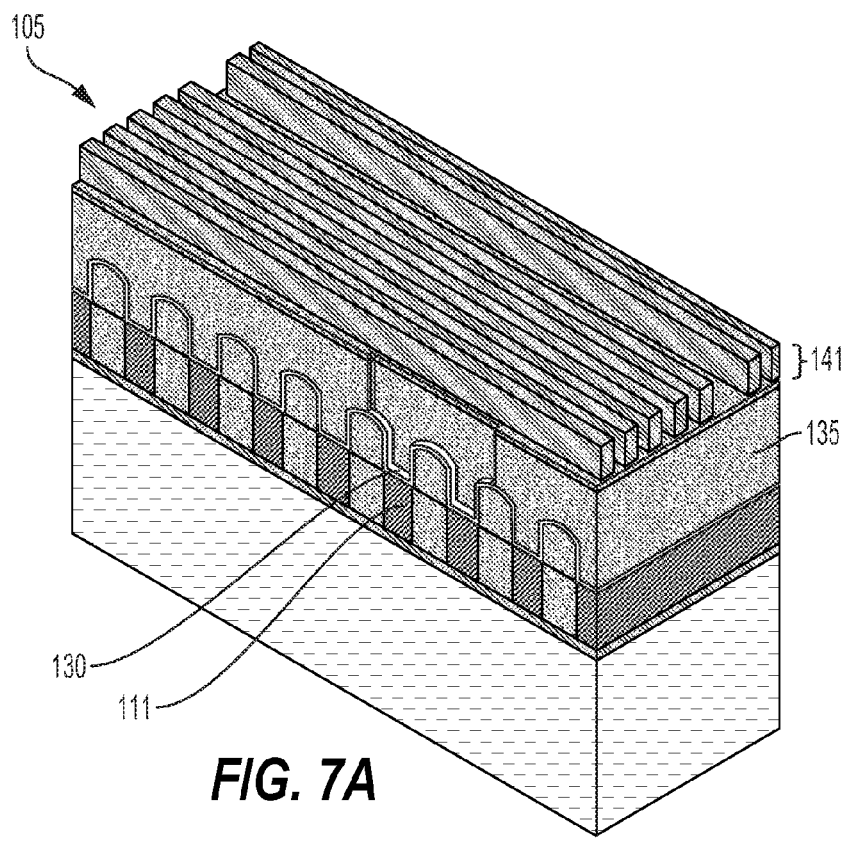
FIGS. 7A and 7B are cross-sectional schematic views of an example substrate segment showing pattern transfer and process flow according to embodiments disclosed herein.
Figure 7B:
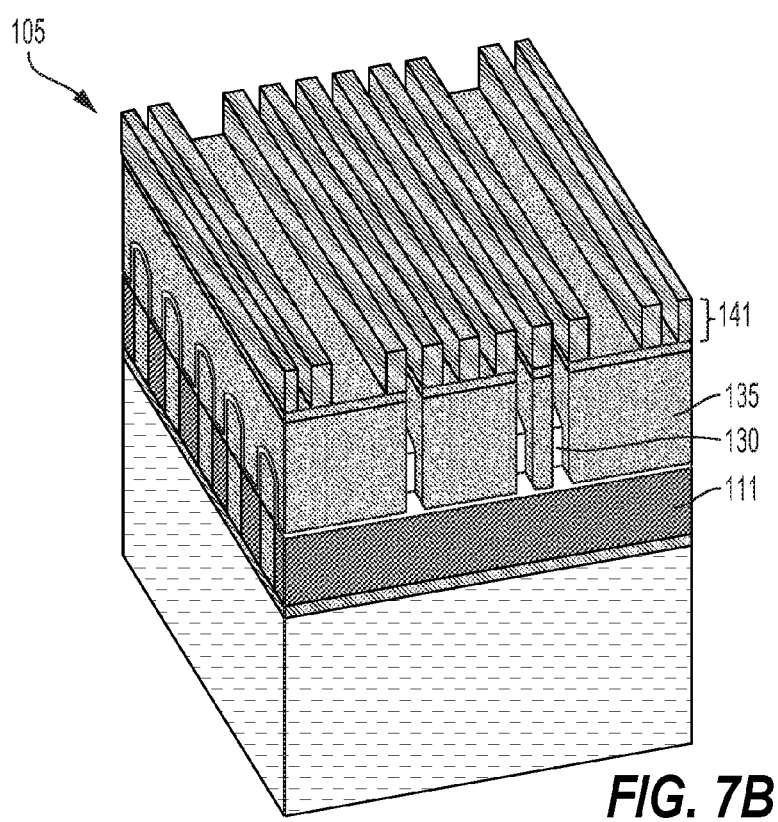

The second relief pattern 142 (or rather the pattern defined by this relief pattern) is transferred into the dielectric layer 135 by using the second relief pattern 142 as a first etch mask and etching through the dielectric layer 135 stopping on the conformal film above the first metal lines. The conformal film 130 prevents etching of the second dielectric lines and the first metal lines uncovered by the second relief pattern. In other words, the substrate is etched down into the dielectric layer 135 to the bottom of the trenches (where the first etch mask allows a directional etch) but stopping on the conformal film directly above the first metal lines. Note that the raised dielectric lines covered in the conformal film function as an alignment guide to make sure vias are etched at desired locations. FIGS. 7A and 7B show an example result after such an etch. These figures are illustrated without the second relief pattern 142 (and accompanying planarization layers) on the substrate to better illustrate how vias are etched down to metal lines without vias overlapping the metal lines. Any overlap from alignment errors lands on top of the raised dielectric lines (second dielectric lines 122). This etch step essentially creates spaces to form vias stopping on a lower shelf or etch stop layer above the first metal lines, but beneath top surfaces of the second dielectric lines.

Figure 8A:
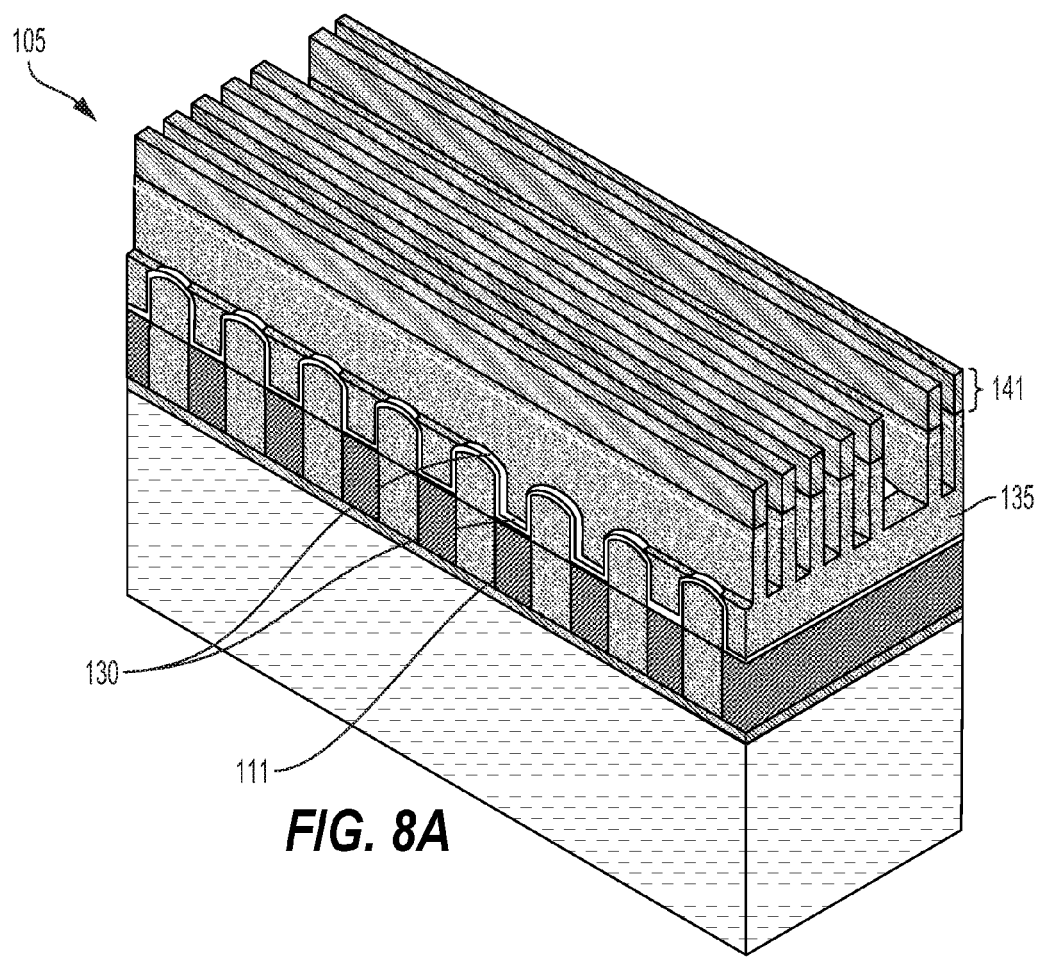
FIGS. 8A and 8B are cross-sectional schematic views of an example substrate segment showing pattern transfer and process flow according to embodiments disclosed herein.
Figure 8B:
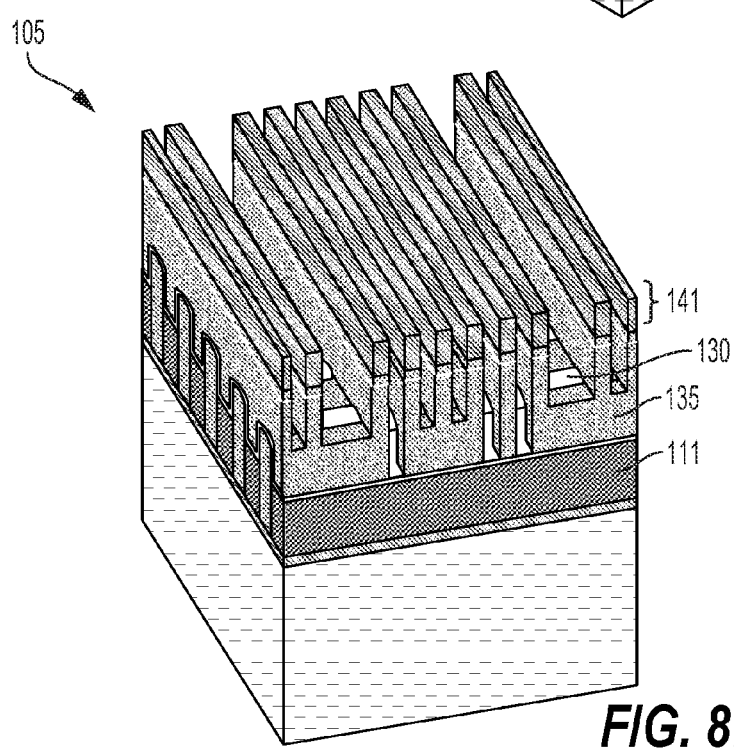

The first relief pattern 141 is transferred into the dielectric layer 135 by using the first relief pattern 141 as a second etch mask and etching into the dielectric layer 135 stopping on top surfaces of the second dielectric lines 122 using the conformal film 130 as an etch stop layer. In other words, trenches (to be filled with metal) are created within the dielectric layer but the dielectric layer is etched only partially and not fully. Etching is executed until top surfaces of the second dielectric lines 122 are uncovered or partially uncovered, that is the conformal film (protective film) on such top surfaces is uncovered. FIGS. 8A and 8B illustrate an example result. Note that top surfaces of the second dielectric lines 122 are uncovered, but dielectric material still fills in trenches between the second dielectric lines, except where vias have been etched. Accordingly, trenches and vias have been created within the dielectric layer 135, with at least the vias being self-aligned and this patterning being protected from overlay errors.

Figure 9A:
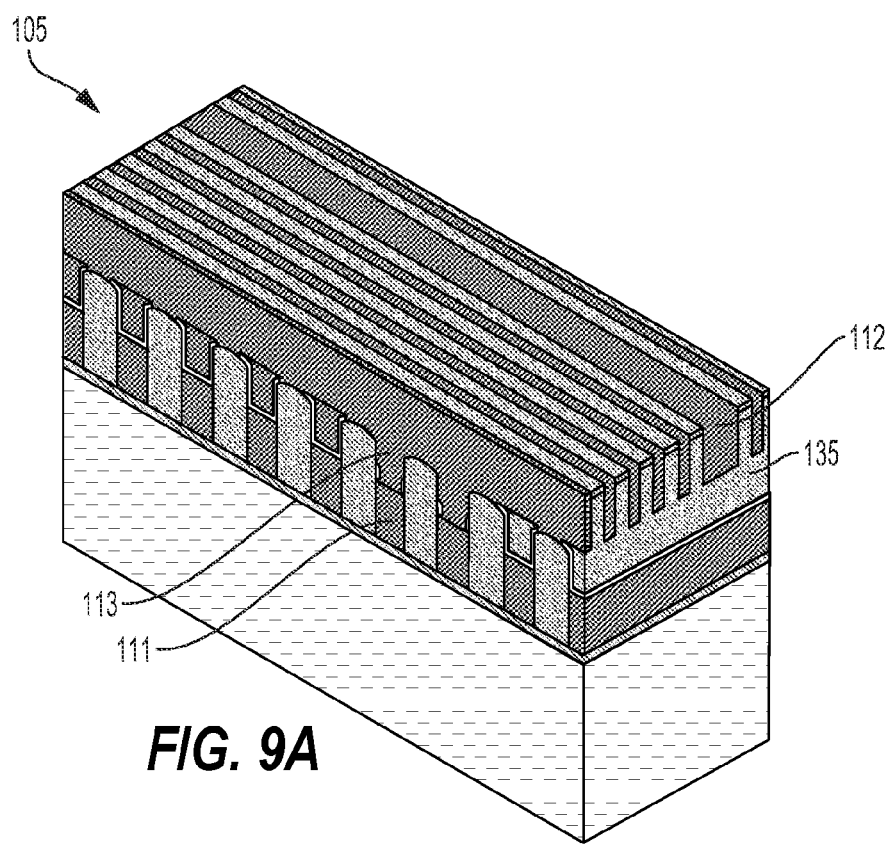
FIGS. 9A and 9B are cross-sectional schematic views of an example substrate segment showing metallization and process flow according to embodiments disclosed herein.
Figure 9B:
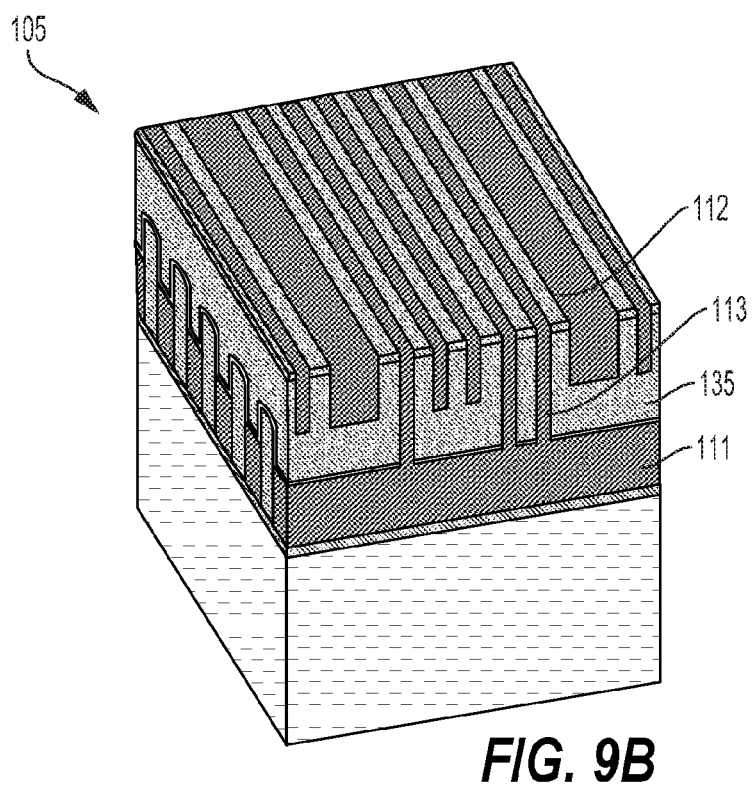

With spaces for wires and vias created, the substrate can be metallized. The first relief pattern 141 is removed, and then the substrate is metallized by filling trenches and vias with a predetermined metal, such as copper, aluminum, et cetera. Metal deposition can result in an overburden of metal, which can then be removed by CMP or other planarization process. An example result is illustrated in FIGS. 9A and 9B. Prior to metallization, and subsequent to removing the first relief pattern and the second relief pattern, uncovered portions of the conformal film can be removed. In other words, a breakthrough etch can be executed to uncover the first metal lines for vias to electrically connect. Such a breakthrough etch can uncover tops of the second dielectric lines, and this is acceptable as both the conformal film and dielectric layer can function as insulators. In some embodiments, all of the dielectric lines and the dielectric layer can be selected from a same material.

Figure 10A:
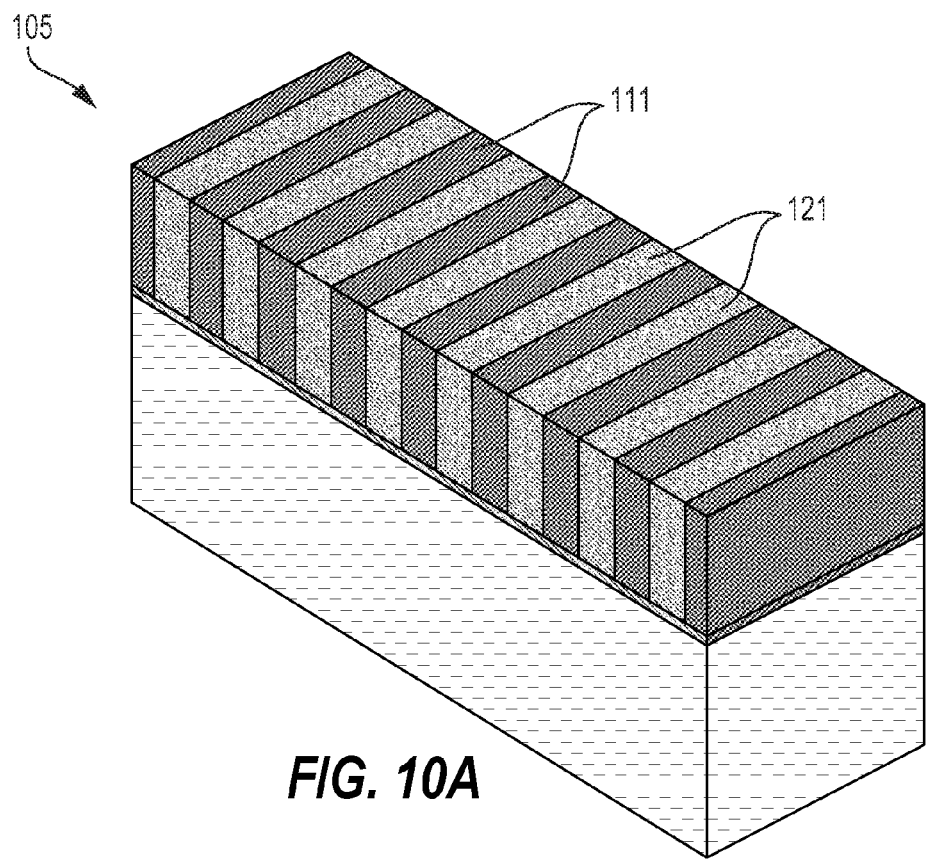
FIGS. 10A and 10B are cross-sectional schematic views of an example substrate segment showing a process flow according to embodiments disclosed herein.
Figure 10B:
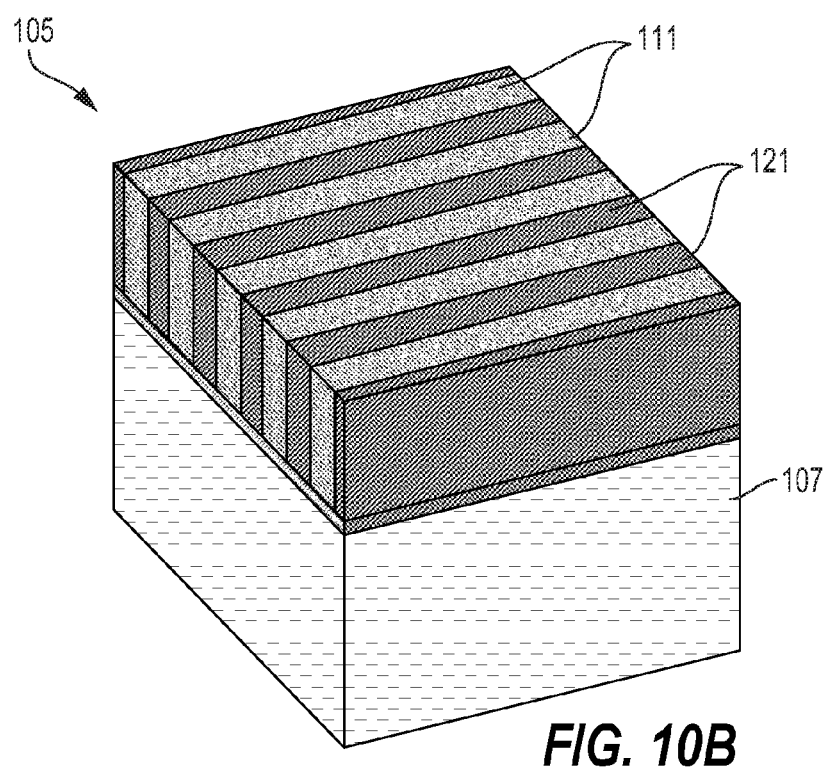
Figure 11A:
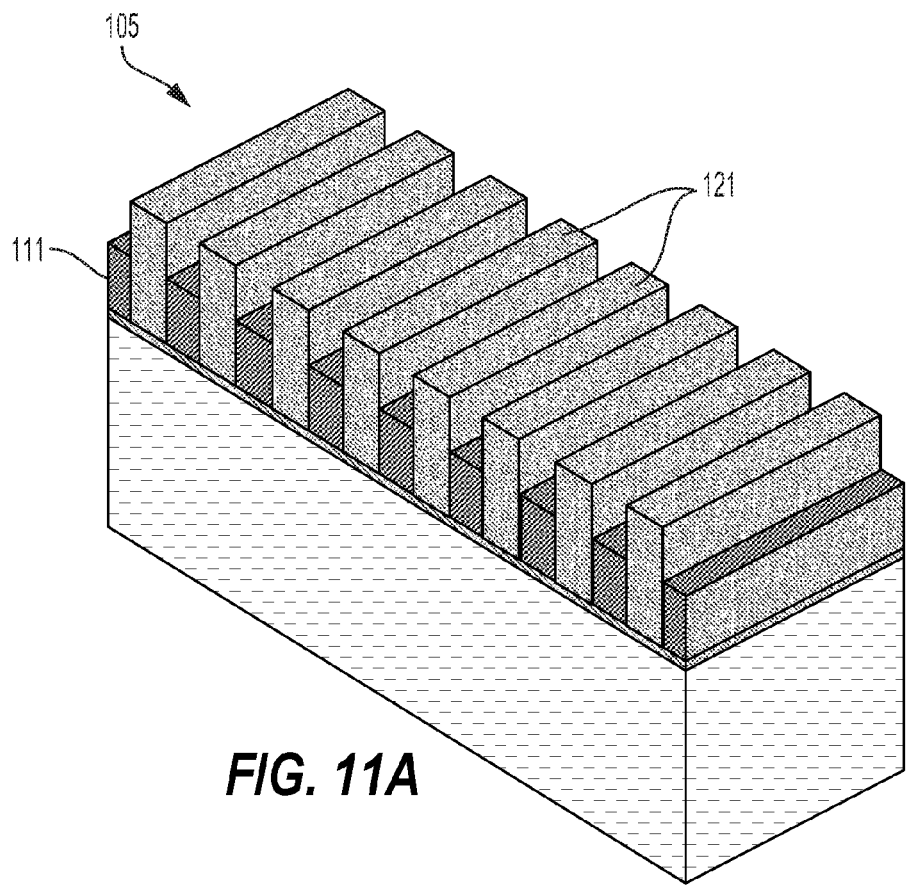
FIGS. 11A and 11B are cross-sectional schematic views of an example substrate segment showing metal recess and process flow according to embodiments disclosed herein.
Figure 11B:
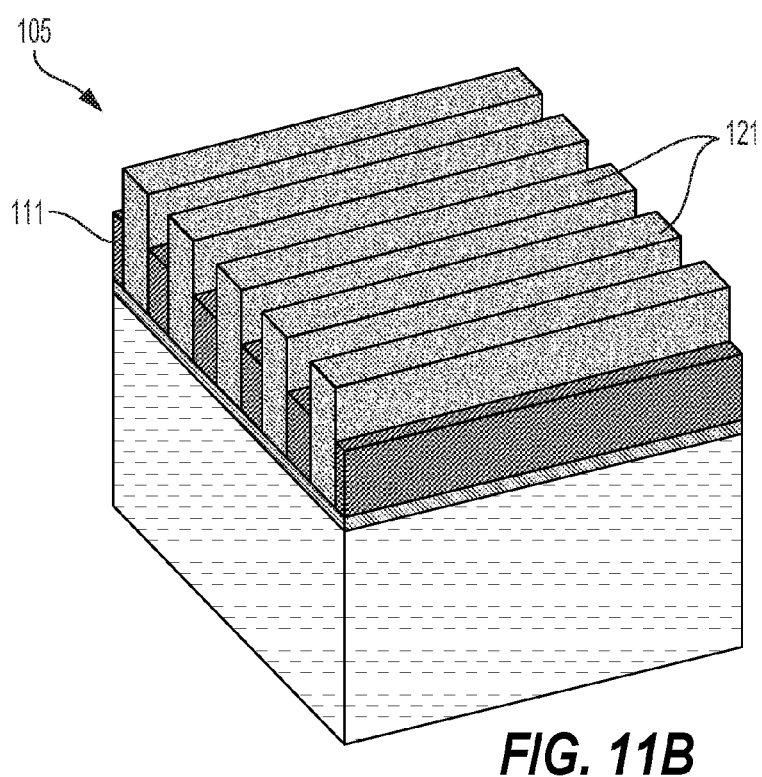
Figure 12A:
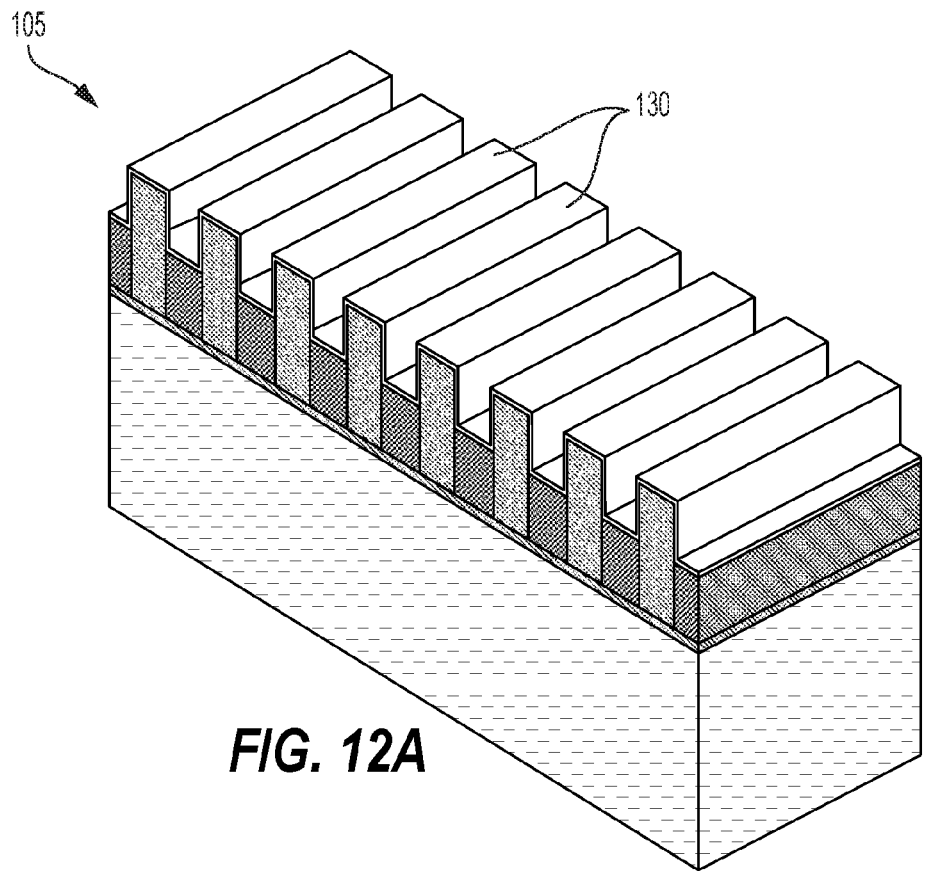
FIGS. 12A and 12B are cross-sectional schematic views of an example substrate segment showing conformal film deposition and process flow according to embodiments disclosed herein.
Figure 12B:
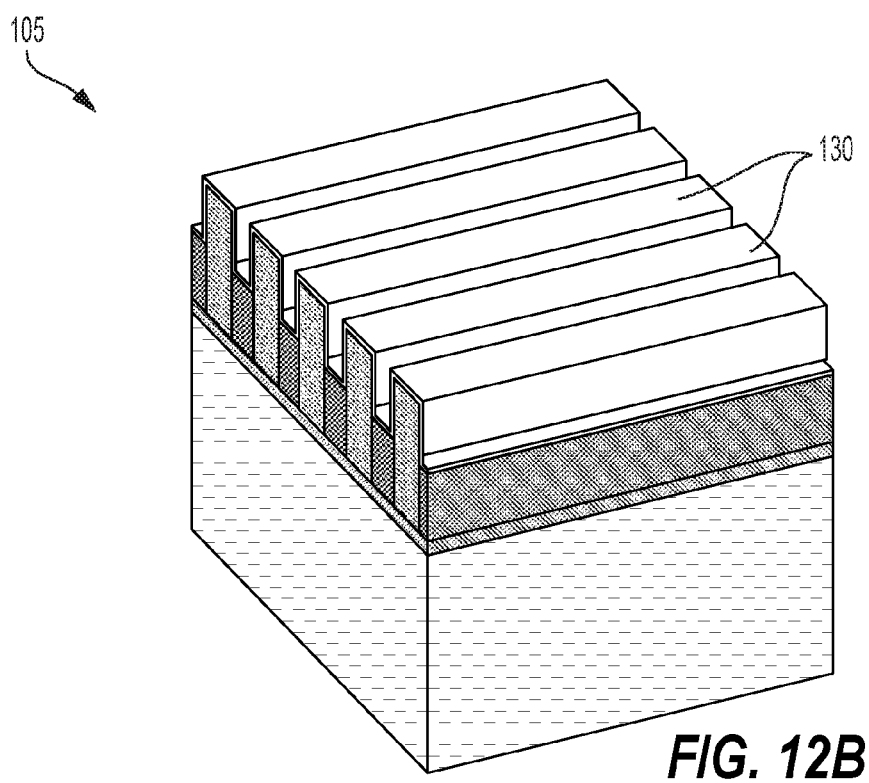

Alternative methods can be used for creating self-alignment of metallization. For example, FIGS. 10A and 10B illustrate one starting point similar to FIGS. 1A and 1B. Instead of selective deposition, however, a recess etch can be used to create self-alignment features. Referring to FIGS. 11A and 11B, an etch process recesses the first metal lines 111 beneath top surfaces of the first dielectric lines 121. This metal recess essentially provides raised dielectric lines to function for self-alignment of vias. FIGS. 12A and 12B show conformal film 130 being deposited on the substrate with recessed metal lines. Process flow can then continue as described above.

Techniques herein provide benefits over conventional techniques. Such benefits include that a via shape is defined by upper and lower metal layers, critical dimension (CD) and critical dimension uniformity are defined by self-alignment. Edge placement error (EPE) is contained through self-alignment. This technique allows for "fly-overs" or adjacent via patterning. Such via patterning can be reduced to "keep" masks. Thus, full self-alignment to both upper and lower metal layer is enabled by techniques herein.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures.

The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for patterning a substrate, the method comprising:
   receiving a substrate having first metal lines that alternate with first dielectric lines on a working surface of the substrate, the first metal lines and the first dielectric lines being uncovered and defining a planar surface together;
   forming second dielectric lines on the first dielectric lines by selectively depositing a dielectric material on the first dielectric lines without depositing the dielectric material on the first metal lines, the second dielectric lines defining trenches leaving the first metal lines uncovered;
   depositing a conformal film on the working surface of the substrate, the conformal film covering sidewalls and top surfaces of the second dielectric lines and covering top surfaces of the first metal lines, the conformal film providing a predetermined etch resistivity;
   depositing a dielectric layer that fills the defined trenches, covers the second dielectric lines, and provides a planar surface to the working surface of the substrate;
   forming a first relief pattern above the dielectric layer, the first relief pattern defining locations of second metal lines to be transferred into the dielectric layer;
   forming a second relief pattern above the dielectric layer, the second relief pattern defining locations of vias to be transferred into the dielectric layer;
   transferring the second relief pattern into the dielectric layer by using the second relief pattern as a first etch mask and etching through the dielectric layer stopping on the conformal film above the first metal lines, the conformal film preventing etching of the second dielectric lines and the first metal lines uncovered by the second relief pattern; and
   transferring the first relief pattern into the dielectric layer by using the first relief pattern as a second etch mask and etching into the dielectric layer stopping on top surfaces of the second dielectric lines using the conformal film as an etch stop layer.

2. The method of claim 1, further comprising:
   removing the second relief pattern and the first relief pattern; and
   metallizing the dielectric layer by filling trenches and vias, defined by the dielectric layer, with a predetermined metal.

3. The method of claim 1, further comprising, subsequent to removing the second relief pattern and the first relief pattern, removing uncovered portions of the conformal film such that top surfaces of the first metal lines are uncovered.

4. The method of claim 1, wherein the first dielectric lines, the second dielectric lines, and the dielectric layer is comprised of a same material.

5. The method of claim 1, wherein forming the first relief pattern includes forming the first relief pattern in a hardmask layer deposited above the dielectric layer.

6. The method of claim 1, wherein forming the second relief pattern above the dielectric layer includes forming the second relief pattern above the first relief pattern.

7. The method of claim 1, wherein forming the second relief pattern above the dielectric layer includes forming the second relief pattern in plane with the first relief pattern.

8. The method of claim 7, wherein forming the second relief pattern in plane with the first relief pattern includes executing a freeze operation that prevents subsequent solubility changes of the first relief pattern.

9. The method of claim 2, wherein the predetermined metal is copper.

10. The method of claim 2, wherein metallizing the dielectric layer includes removing an overburden of the predetermined metal above a top surface of the dielectric layer.

* * * * *